(12) United States Patent
Kim et al.

(10) Patent No.: US 7,586,119 B2
(45) Date of Patent: Sep. 8, 2009

(54) LOW TEMPERATURE-CURED POLYMER GATE INSULATION LAYER AND ORGANIC THIN FILM TRANSISTOR USING THE SAME

(75) Inventors: Gi Heon Kim, Daejeon (KR); Sung Min Yoon, Daejeon (KR); In Kyu You, Daejeon (KR); Seung Youl Kang, Daejeon (KR); Seong Deok Ahn, Daejeon (KR); Kyu Ha Baek, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 619 days.

(21) Appl. No.: 11/354,711

(22) Filed: Feb. 15, 2006

(65) Prior Publication Data

US 2007/0085071 A1    Apr. 19, 2007

(30) Foreign Application Priority Data

Sep. 13, 2005    (KR) ............... 10-2005-0085167

(51) Int. Cl.
*H01L 35/24* (2006.01)

(52) U.S. Cl. .................. 257/40; 549/557; 549/561; 549/512; 525/117

(58) Field of Classification Search ............ 549/557, 549/561, 512; 525/117
See application file for complete search history.

(56) References Cited

U.S. PATENT DOCUMENTS

| | | | | |
|---|---|---|---|---|
| 5,510,428 A | * | 4/1996 | Harano et al. | 525/438 |
| 6,399,267 B1 | * | 6/2002 | Nishimura et al. | 430/192 |
| 7,321,413 B2 | * | 1/2008 | Nakata | 349/138 |

FOREIGN PATENT DOCUMENTS

| | | |
|---|---|---|
| JP | 2000347397 | 12/2000 |
| JP | 2003078494 | 9/2003 |
| JP | 2004235298 | 8/2004 |
| KR | 10-1998080190 | 11/1998 |
| KR | 20030016981 | 3/2003 |
| KR | 10-20040028010 | 4/2004 |

* cited by examiner

*Primary Examiner*—Randy Gulakowski
*Assistant Examiner*—Rachel Kahn
(74) *Attorney, Agent, or Firm*—Ladas & Parry LLP

(57) ABSTRACT

Provided are a low temperature-cured polymer gate insulation layer and an organic thin film transistor having the same. The gate insulation layer includes an acrylate-based compound, an anhydride-based compound, and an epoxy-based compound each by 0.1 weight % or more.

10 Claims, 2 Drawing Sheets

LOW TEMPERATURE-CURED POLYMER GATE INSULATION LAYER AND ORGANIC THIN FILM TRANSISTOR USING THE SAME

CROSS-REFERENCE TO RELATED APPLICATION

This application claims priority to and the benefit of Korean Patent Application No. 2005-85167, filed Sep. 13, 2005, the disclosure of which is incorporated herein by reference in its entirety.

BACKGROUND

1. Field of the Invention

The present invention relates to a low temperature-cured polymer gate insulation layer and an organic thin film transistor using the same, and more particularly, to a gate insulation layer with chemical resistance, heat resistance, and excellent surface characteristics that is capable of improving an electrical characteristic of an organic thin film transistor using a low temperature-cured polymer, and the organic thin film transistor using the same.

2. Discussion of Related Art

In general, a number of conjugated organic polymers display desirable physical properties that can possibily be exploited in various semiconductor configurations. A number of organic semiconductors materials has been actively studied in hopes of exploiting their respective physical properties in new electric and electronic materials. It is hoped that these unique physical properties exhibited by conjugated organic polymers may be able to be exploited in a number of broad fields such as functional electronic devices and optical devices. Some of these unique physical properties include a wide diversity of synthesizing methods, easiness in shaping a fiber or film form, flexibility, conductivity, and a low production cost. Many of these unique physical properties could not be obtained from conventional inorganic semicondutors such as amorphous silicon or poly silicon.

Among these devices include the well known organic thin film transistor which use organic materials as an active region. The organic thin film transistor is almost similar in structure with a the silicon thin film transistor (Si-TFT) except that the organic material is used instead of silicon (Si) in a semiconductor region. In the organic thin film transistor, a thin film can be more conveniently formed by using room-pressure wet method methods (printing coating, spin coating, and bar coating), instead of using chemical vapor deposition methods that require plasma for forming a conventional silicon thin film. Further organic thin film transistors enioy the advantage in that a relatively low-priced transistor can be realized using a roll to roll manufacturing technique that uses a plastic substrate.

At present, it is expected that the organic thin film transistor be used for a driving device of a plastic-based active type organic light emitting device, a smart card, and an inventory tag plastic chip. The efficiency of the organic thin film transistor is dependent on crystallization of an organic active layer, a charge characteristic of an interface between an organic insulation layer and the organic active layer, a thin film characteristic of the organic insulation layer, and an ability for carrier injection into an interface between a source/drain electrode and the organic active layer. In order to improve such the characteristics, various methods are being attempted.

A material is required to have a low electrical conductivity and a high breakdown field characteristic in order to be used for a gate insulation layer of the organic thin film transistor. While a silicon oxide layer is presently used as the gate insulation layer of the organic thin film transistor, a ferroelectric insulator series such as $Ba_xSr_{1-x}TiO_3$ (BST), $Ta_2O_5$, $Y_2O_3$, and $TiO_2$ and an inorganic dielectric substance having a larger permittivity, such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, and $Bi_4Ti_3O_{12}$, are used to reduce a threshold voltage (U.S. Pat. No. 5,946,551, and Korean Patent Laid-Open Publication Nos. 1020020084427 and 1020020034873).

A film-forming temperature of an inorganic insulation layer is high and therefore, when being applied to the organic thin film transistor, it can have influence upon physical/chemical properties of a substrate used (particularly, a plastic substrate) and other layers formed on the substrate in an earlier process (Hereinafter, referred to as "earlier processed layer"), thereby affecting a transistor characteristic. Accordingly, a low temperature process is made possible so that a research on a new organic gate insulation layer capable of minimally affecting the earlier processed layer is under active progress. An example of the organic insulation layer includes polyimide (Korean Patent Laid-Open Publication No. 1020030016981), poly vinyl alcohol (Korean Paten Laid-Open Publication No. 1020020084427), poly (vinyl phenol-maleiimide) (Korean Paten Laid-Open Publication No. 1020040028010), and photo acryl. However, they do not have a device characteristic to substitute for the conventional inorganic insulation layer. Accordingly, in order to implement a high-efficiency organic thin film transistor, it is highly required not only to develop a material for the organic active layer but also to develop a polymer gate insulation layer with an excellent device characteristic in which the thin film can be formed through a simplified process without affecting the substrate and the earlier processed layer.

Accordingly, inventors of this application discovered that, when the gate insulation layer is formed of an acrylate-based compound, an anhydride-based compound, and an epoxy-based compound, it can be cured at a low temperature, and the formed gate insulation layer has excellent chemical resistance, heat resistance, and surface characteristics and further, discovered that applying the formed gate insulation layer to organic thin film transistors improves an electrical characteristic, and completed the present invention.

SUMMARY OF THE INVENTION

The present invention is directed to implementation of a low temperature-cured polymer gate insulation layer.

The present invention is also directed to implementation of an organic thin film transistor having a low temperature-cured polymer gate insulation layer.

One aspect of the present invention provides a low temperature-cured polymer gate insulation layer comprising an acrylate-based compound of Chemical Formula (I), an anhydride-based compound of Chemical Formula (II), and an epoxy-based compound of Chemical Formula (III) each by 0.1 weight % or more:

[Chemical Formula 1]

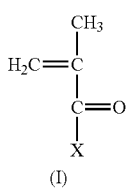

(I)

wherein,
X is

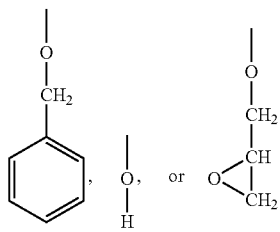

[Chemical Formula 2]

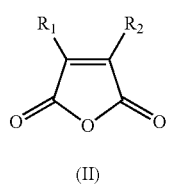

(II)

wherein, $R_1$ and $R_2$ are hydrogen, respectively, or $R_1$ and $R_2$ can form unsubstituted or substituted $C_4$-$C_6$ aromatic rings with carboxyl group.

[Chemical Formula 3]

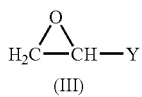

(III)

wherein,
Y is

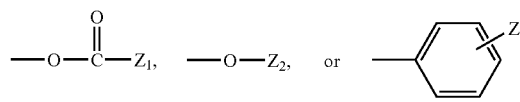

wherein $Z_1$, $Z_2$, and $Z_3$ denote independently aromatic or aliphatic structures of $C_1$ to $C_{30}$, respectively, and have zero to three epoxy groups on ends.

Another aspect of the present invention provides an organic thin film transistor comprising an organic active layer, a gate electrode, and source-drain electrodes, wherein the transistor comprises a low temperature-cured polymer gate insulation layer comprises an acrylate-based compound of Chemical Formula (I), an anhydride-based compound of Chemical Formula (II), and an epoxy-based compound of Chemical Formula (III) each by 0.1 weight % or more, on the gate electrode.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Figure 1:
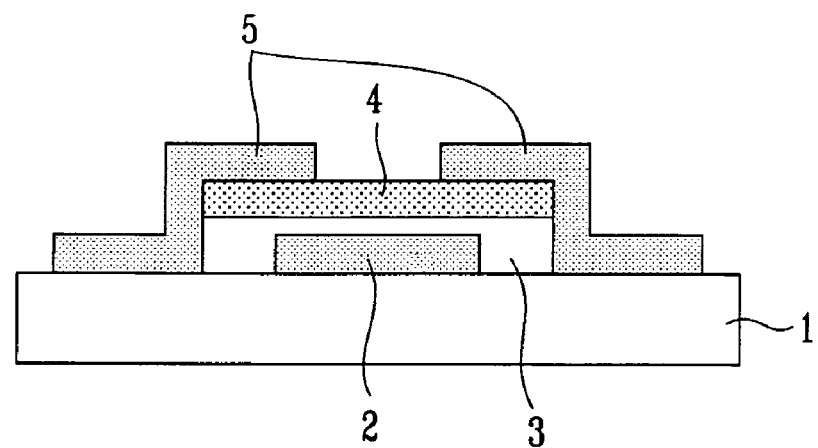
FIG. 1 is a cross-sectional view illustrating the structure of an organic thin film transistor according to an embodiment of the present invention.

Hereinafter, an exemplary embodiment of the present invention will be described in detail.

A low temperature-cured gate insulation layer according to the present invention comprises an acrylate-based compound of Chemical Formula (I), an anhydride-based compound of Chemical Formula (II), and an epoxy-based compound of Chemical Formula (III) each by 0.1 weight % or more:

[Chemical Formula 1]

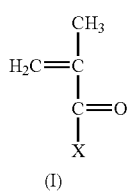

(I)

wherein,
X is

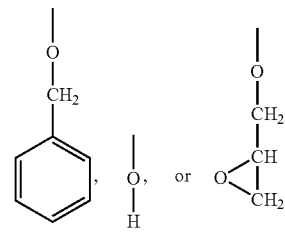

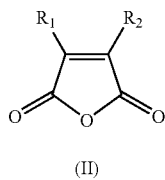

[Chemical Formula 2]

wherein,

R₁ and R₂ are hydrogen, respectively, or R₁ and R₂ can form unsubstituted or substituted $C_4$-$C_6$ aromatic rings with carboxyl group.

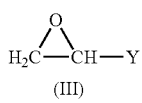

[Chemical Formula 3]

wherein,

Y is

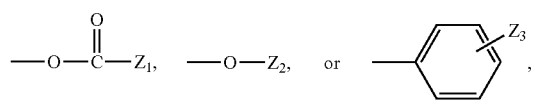

wherein $Z_1$, $Z_2$, and $Z_3$ denote independently aromatic or aliphatic structures of $C_1$ to $C_{30}$, respectively, and have zero to three epoxy groups on ends.

Preferable acrylate-based compounds according to the present invention can be given in the following Chemical Formulae 4 to 6, and can be used in single or combination:

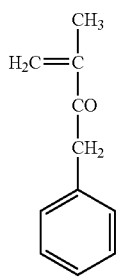

[Chemical Formula 4]

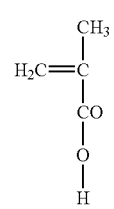

[Chemical Formula 5]

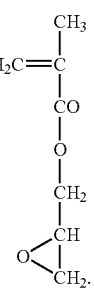

[Chemical Formula 6]

Preferable anhydride-based compounds according to the present invention can be given in the following Chemical Formulae 7 to 9, and can be used in single or combination:

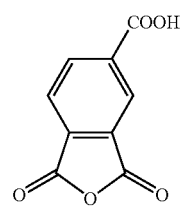

[Chemical Formula 7]

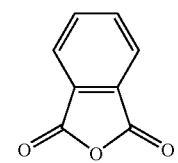

[Chemical Formula 8]

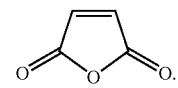

[Chemical Formula 9]

Preferable epoxy-based compounds according to the present invention can be given in the following Chemical Formulae 10 to 14, and can be used in single or combination:

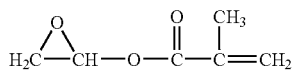

[Chemical Formula 10]

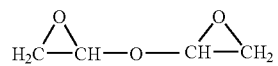

[Chemical Formula 11]

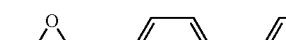

[Chemical Formula 13]

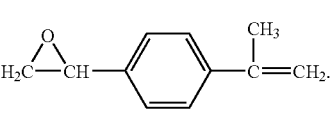

[Chemical Formula 14]

It is desirable that the acrylate-based compound, the anhydride-based compound, and the epoxy-based compound being reactive monomers of the gate insulation layer are used to be within a range of 0.1 weight % to 99 weight %, respectively.

The acrylate-based compound of the Chemical Formula (I) forming a main structure of the gate insulating layer is a reactive compound determining electrical, chemical, and physical properties. The anhydride-based compound of the Chemical Formula (II) reduces a curing temperature (150° C. or less) required when the gate insulation layer is formed, and increases a curing rate, thereby making it possible to perform fast curing at a low temperature of the gate insulation layer. The epoxy-based compound of the Chemical Formula (III) serves to improve chemical and electrical characteristics of the resulted polymer insulation layer by cross-linking with the acrylate-based compound being a main reactant in forming the gate insulation layer.

The gate insulation layer according to the present invention is fabricated through the steps of dissolving a gate insulation layer composition comprising the acrylate-based compound of the Chemical Formula (I), the anhydride-based compound of the Chemical Formula (II), and the epoxy-based compound of the Chemical Formula (III) in organic solvent; coating a substrate on which the gate insulation layer is formed, with the obtained solution; and thermally curing the coated substrate at the low temperature to form the gate insulation layer.

In the dissolving step, the acrylate-based compound of the Chemical Formula (I), the anhydride-based compound of the Chemical Formula (II), and the epoxy-based compound of the Chemical Formula (III) being the reactive monomers are contained preferably by 0.1 weight % or more, or are contained more preferably by 0.1 weight % to 99 weight %, respectively.

In addition to the exemplified reactive monomers, other reactive monomers can be separately added in consideration of the physical, chemical, and electrical characteristics of the gate insulation layer finally obtained. In this case, the reactive monomers of the Chemical Formulas (I), (II), and (III) can be partially limited in use as well.

Organic solvent may be solvent having an excellent coating characteristic, such as propylene glycol monomethyl ether acetate, di(ethylene glycol)methyl ethyl ether, cyclohexanone, N-methyl-2-pyrrolidone(NMP), or toluene. The acrylate-based compound, the anhydride-based compound, and the epoxy-based compound can be concurrently dissolved in the organic solvent, or each of them can be also mixed after dissolved in a suitable organic solvent.

The concentration of the compound in the organic solvent can be suitably selected by considering easiness of coating, solvent removal, and a final thickness.

In the coating step, a coating method may be a method well known in the art, for example, a wet method such as spin coating, dipping, or printing.

In the thermally curing step, the curing should be performed at the temperature of 150° C. or less. The curing time can vary with a coating thickness or a kind of the organic solvent.

The inventive organic thin film transistor according to the present invention comprises an organic active layer, a gate electrode, and a source/drain electrode, and further comprises the polymer gate insulation layer formed by low temperature-curing the acrylate-based compound of the Chemical Formula (I), the anhydride-based compound of the Chemical Formula (II), and the epoxy-based compound of the Chemical Formula (III) each contained by 0.1 weight % or more on the gate electrode.

The organic thin film transistor can be formed to have a generally known structure of substrate/gate electrode/gate insulation layer/organic active layer/source-drain electrodes, or of substrate/gate electrode/gate insulation layer/source-drain electrodes/organic active layer. However, the present invention is not limited to such structures and other structures may be applied.

FIG. 1 is a schematic view illustrating the structure of an organic thin film transistor according to an embodiment of the present invention.

Referring to FIG. 1, the organic thin film transistor includes a substrate 1, a gate electrode 2, a gate insulation layer 3, an organic active layer 4, and source-drain electrodes 5 that are stacked in sequence.

In FIG. 1, respective parts are indicated to provide easy recognition, not with an actual layer thickness.

The substrate 1 may be one of substrates well known in the art. For example, a glass, a silicon wafer, or a plastic may be used as the substrate 1, but the present invention is not limited thereto.

The gate electrode 2 is formed on the substrate 1 through any method well known in the art, for example, an electron-beam method using a shadow mask. A metal well known in the art may be used as the gate electrode 2. The metal includes gold (Au), sliver (Ag), nickel (Ni), indium-tin-oxide (ITO), aluminum (Al), titanium (Ti). titanium nitride (TiN), and chrome (Cr), but the present invention is not limited thereto.

The gate insulation layer 3 is formed on the gate electrode 2, and is a composition containing 0.1 weight % or more of each of the acrylate-based compound of the Chemical Formula (I), the anhydride-based compound of the Chemical Formula (II), and the epoxy-based compound of the Chemical Formula (III).

The gate insulation layer 3 is formed on the gate electrode through a wet process. In detail, the gate insulation layer composition is coated through spin coating, dipping, or printing and is then thermally cured at a low temperature of 150° C. to form the gate insulation layer 3.

The organic active layer 4 is formed on the gate insulation layer 3. A general material such as pentacene, dihexyl sexithiophene (DH6T), poly-(3-hexylthiophene) regioregular (P3HT), poly(9,9-dioctylfluorene-co-bithiophene) (F8T2), and dihexylanthradithiophene (DHADT), or a derivative thereof may be used as a material of the organic active layer 4, but the present invention is not limited thereto. The organic active layer 4 can be formed through a method such as a method of depositing the materials in a condition well known in the art.

A general metal such as gold (Au), indium-tin-oxide (ITO), aluminum (Al), or chrome (Cr) may be used as the source-drain electrodes 5, but the present invention is not limited thereto.

The source-drain electrodes 5 are formed on the organic active layer 4 through a method well known in the art, and can be preferably formed using an electron-beam method using the shadow mask.

The substrate 1, the gate electrode 2, the gate insulation layer 3, the organic active layer 4, and the source-drain electrodes 5 each can be formed to a thickness well known in the art.

Hereinafter, an embodiment of the present invention will be in more detail described, but the present invention is not limited to the embodiment.

EXAMPLE 1

Preparation of Gate Insulation Layer Composition

The compounds of the following Chemical Formulae 4, 5, 6, and 7 each having 30 weight %, 40 weight %, 10 weight %, and 10 weight % base on a total composition weight (excluding solvent) were dissolved in propylene glycol monomethyl ether acetate (PGMEA) at a concentration of 25 weight % and then, the compound of the following Chemical Formula 10 of 10 weight % was dissolved in di-(ethylene glycol) methyl ethyl ether at a concentration of 4.8 weight %, respectively. Completely dissolved solutions were mixed at a ratio of 7.7 to 2.3, thereby preparing the gate insulation layer composition.

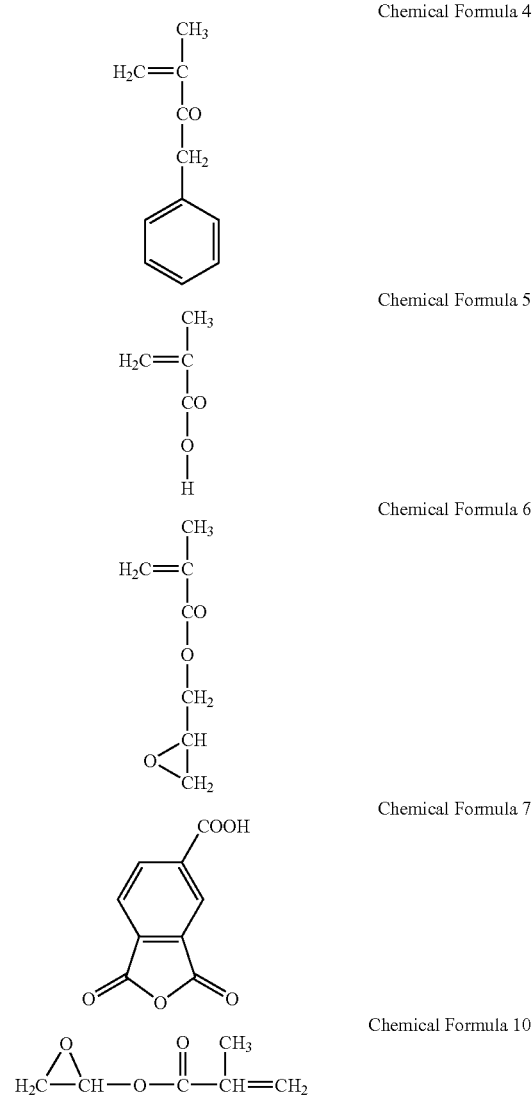

Chemical Formula 4

Chemical Formula 5

Chemical Formula 6

Chemical Formula 7

Chemical Formula 10

Fabrication of Organic Thin Film Transistor

The gate electrode of Ti (50 Å)/Au (500 Å) was formed on the plastic substrate (poly (ether sulfone)) through the electron-beam method using the shadow mask.

Subsequently, the formed gate insulation layer composition was coated on the gate electrode to have a thickness of 6750 Å at 3000 rpm of the spin coating and then, was baked for sixty minutes at 150° C., thereby forming the gate insulation layer.

Next, the pentacene was deposited in a condition of a low vacuum degree of less than $1.0 \times 10^{-6}$ torr, a substrate temperature of 70° C., and a deposition rate of 1 Å/sec, to have a thickness of 1000 Å, thereby forming a pentacene active layer. The source-drain electrode was formed of gold (Au) to have a channel width of 2 mm, a channel length of 100 μm, and a thickness of 500 Å through the electron-beam method using the shadow mask.

Experiment

Measurement of Leakage Current Density Characteristic

Figure 2:
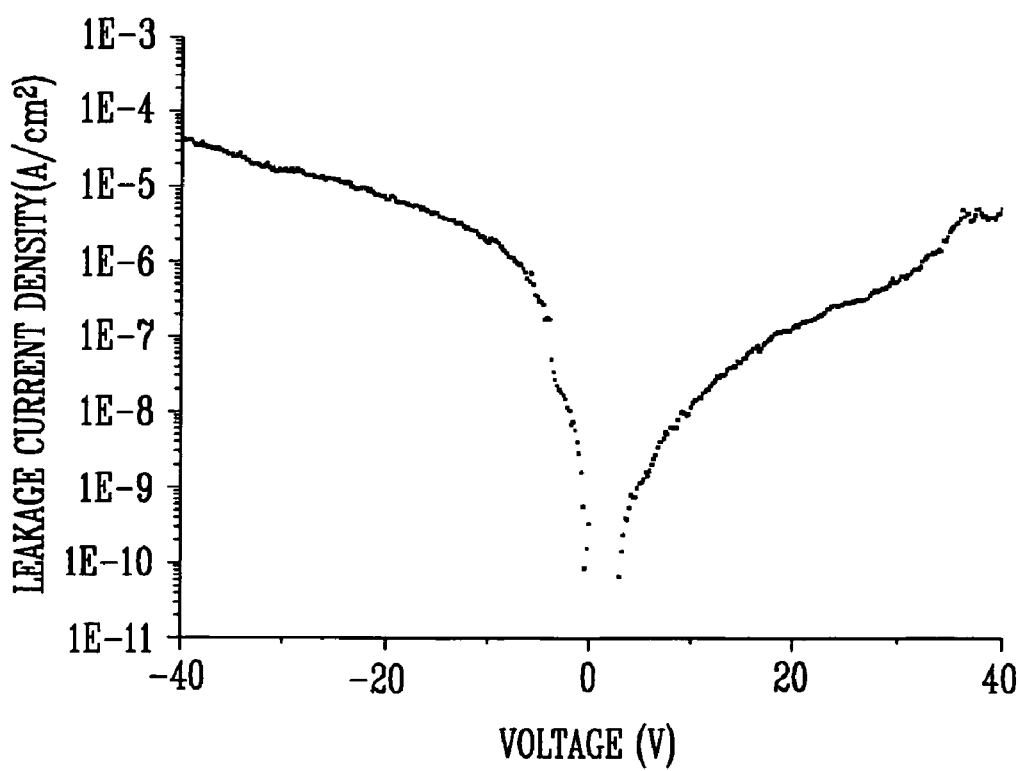
FIG. 2 is a graph of leakage current density versus voltage in a low temperature-cured polymer gate insulation layer according to an exemplary embodiment of the present invention.

Leakage current density-voltage (J-V) was measured and its result is shown in FIG. 2 in order to obtain the electrical characteristic of the gate insulation layer formed of the composition comprising the acrylate-based compound, the anhydride-based compound, and the epoxy-based compound. A sample for measurement employs the gate insulation layer, which is obtained by spin coating the gate insulation layer composition of the Example 1 on the glass substrate at 3000 rpm to have a thickness of 6750 Å, and baking the coated composition for sixty minutes at 150° C.

Evaluation for Dielectric Characteristic

Figure 3:
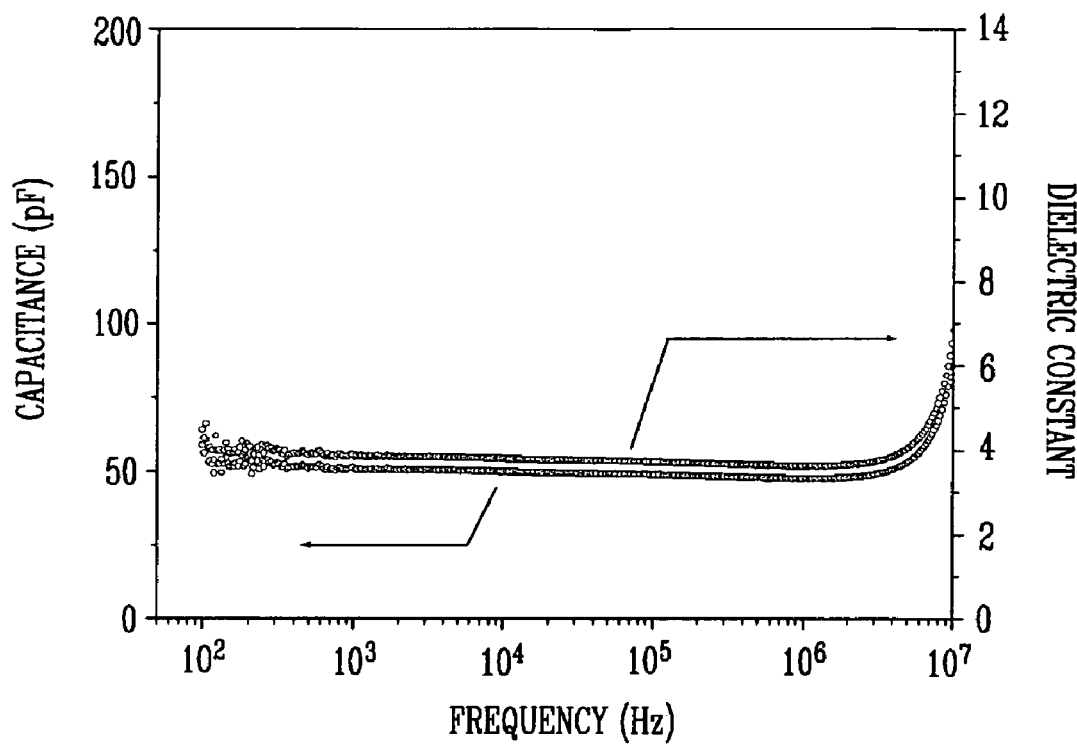
FIG. 3 is a graph of capacitance versus voltage in a low temperature-cured polymer gate insulation layer according to an exemplary embodiment of the present invention.

In a second evaluation for obtaining a dielectric characteristic of the gate insulation layer, a capacitance-frequency (C—F) curve was obtained from the same gate insulation layer as that used in evaluation of the leakage current density characteristic, and its result is shown in FIG. 3. From the obtained result of FIG. 3, the permittivity and dielectric loss values of the insulation layer were calculated in the following Equations and were shown in Table 1:

TABLE 1

| | Additive | Weight % (of total weight) | Thickness (Å) | Permittivity (at 1 MHz) | Dielectric loss (at 1 MHz) |
|---|---|---|---|---|---|
| Gate insulation layer | Formula 4 | 30 | 6750 | 3.6 | 0.02 |
| | Formula 5 | 40 | | | |
| | Formula 6 | 10 | | | |
| | Formula 7 | 10 | | | |
| | Formula 10 | 10 | | | |

$$C(\text{capacitance}) = \varepsilon_r \varepsilon_o \frac{d}{A} \quad [\text{Equation 1}]$$

where,
d: thickness,
A: area, and
$\varepsilon_o$: air or vacuum dielectric constant $$\varepsilon_r(\text{permittivity}) = \frac{Cd}{\varepsilon_o A} \quad [\text{Equation 2}]$$

As can be seen from FIGS. 2 and 3, the gate insulation layer according to the present invention shows a typical characteristic curve observed from a conventional insulation layer material. In other words, it does not exhibit a phenomenon in which capacitance greatly varies with a magnitude of a sweep voltage or a hysteretic curve of the capacitance varies with a sweep direction of the voltage.

Evaluation for Chemical Resistance, Heat Resistance and Surface Characteristics

In order to evaluate the chemical resistance, the same gate insulation layer as used in the evaluation for the leakage current density characteristic was impregnated in the organic solvent mainly used for a semiconductor process, that is, in acetone, isopropyl alcohol, water, phosphoric acid solution, hydrofluoric acid solution, or potassium hydroxide (KOH) solution for ten minutes, respectively and was dried and then, existence or absence of a physical/chemical defect of the thin film was checked with naked eyes. As a result, any crack on a surface of the thin film was not generated and, when the thin film was impregnated in the organic solvent, any evidence of action could not be observed.

It can be confirmed that even though the thin film was left alone at 200° C. for a long time (e.g., four hours) so as to evaluate the heat resistance of the thin film, there is no change in any physical surface property (e.g., surface evenness and contact angle). As a result of evaluating the surface characteristic of the thin film using an atomic force microscopy (AFM), the evenness was highly excellent to have 3 Å of a root-mean-square (rms).

Meantime, many polymers are being considered in their applications as insulators. In particular, poly imide, poly (methylmeth acrylate) (permittivity of 2.6), poly (p-xlylene) (permittivity of 2.5), poly vinyl alcohol (permittivity of 4.3), polyvinyl phenol (permittivity of 6.2) are being widely used. While such polymers have an advantage in that the polymers can be easily applied to a large area in low cost, there is a limitation in applying the polymers to the process because of their insufficient chemical resistance to the organic solvent used in the process. On the other hand, according to the present invention, as the curing reaction is performed at a low temperature and the polymer is cross-linked, the polymer has sufficient chemical resistance, higher permittivity, and low leakage current characteristics, as appreciated from the above test result. Accordingly, the polymers can be easily applied to organic thin film transistors.

Measurement of Current Transfer Characteristic

Figure 4:
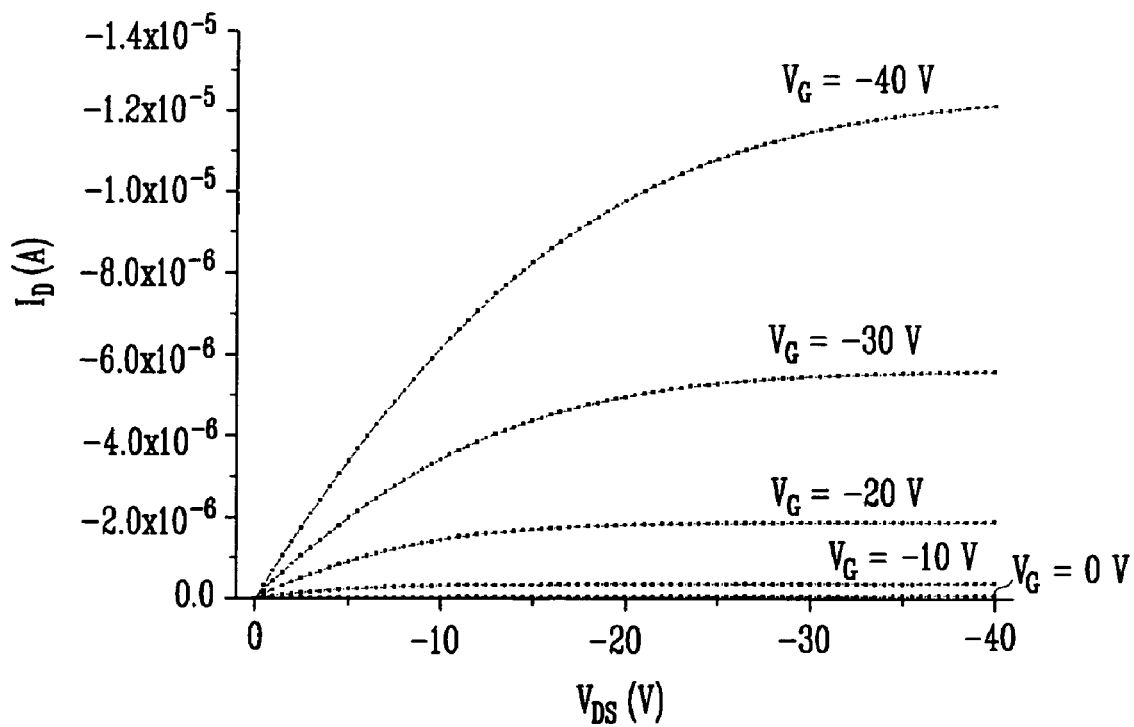
FIG. 4 is a graph illustrating a current transfer characteristic of an organic thin film transistor according to an embodiment of the present invention.

A current transfer characteristic of the organic thin film transistor fabricated in the Example 1 was measured using a semiconductor parameter analyzer 4145A(HP), and its result was shown in FIG. 4.

As can be seen from FIG. 4, the electrical characteristic of the inventive organic thin film transistor is improved.

As described above, the gate insulation layer according to the present invention can be formed at the low temperature, thereby minimizing the influence on an earlier processed layer and enhancing selectivity of the earlier processed layer. Thus, a structure of the organic thin film transistor can be diversified.

Further, the gate insulation layer according to the present invention is excellent in chemical resistance, heat resistance, and surface characteristics. The gate insulation layer according to the present invention can be formed through the wet process, thereby allowing for fabricating an organic thin film transistor on a large substrate.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A low temperature-cured polymer gate insulation layer comprising:
an acrylate-based compound of Chemical Formula (I), an anhydride-based compound of Chemical Formula (II), and an epoxy-based compound of Chemical Formula (III) each by 0.1 weight % or more:

Chemical Formula (I) comprises

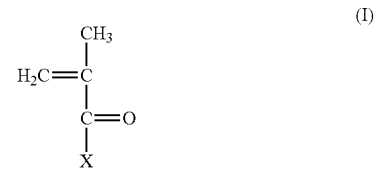

wherein,
X is

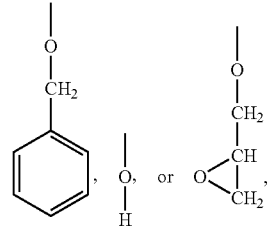

Chemical Formula (II) comprises

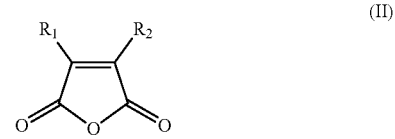

wherein,
$R_1$ and $R_2$ are independent hydrogen, respectively, or $R_1$ and $R_2$ can form unsubstituted or substituted $C_4$-$C_6$ aromatic rings with carboxyl group, and Chemical Formula (III) comprises

wherein
Y is

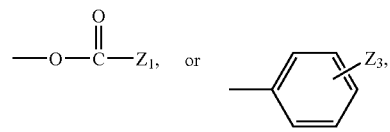

wherein $Z_1$, and $Z_3$ denote independently aromatic or aliphatic structures of $C_1$ to $C_{30}$, respectively, and have zero to three epoxy groups on ends.

2. The low temperature-cured polymer gate insulation layer according to claim 1, wherein the acrylate-based compound of the Chemical Formula (I), the anhydride-based compound of the Chemical Formula (II) and the epoxy-based compound of the Chemical Formula (III) are all contained by 0.1 weight % to 99 weight %.

3. The low temperature-cured polymer gate Insulation layer according to claim 1, wherein the acrylate-based compound of the Chemical Formula (I) comprises at least two of the compounds given in Chemical Formulae (IV), (V) and (VI) below:

Chemical Formula (IV)

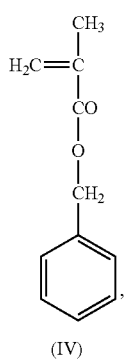

(IV)

Chemical Formula (V)

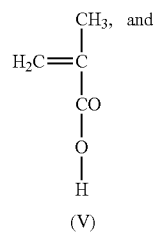

(V)

Chemical Formula (VI)

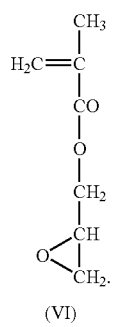

(VI)

4. The low temperature-cured polymer gate insulation layer according to claim 1, wherein the anhydride-based compound of the Chemical Formula (II) is at least one of compounds given in Chemical Formulae (VII) to (IX) below:

Chemical Formula (VII)

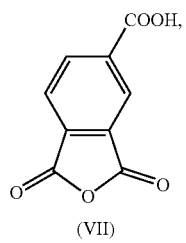

(VII)

Chemical Formula (VIII)

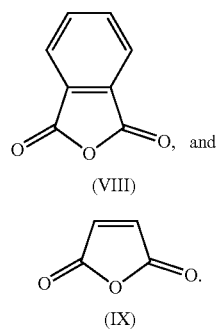

(VIII)

Chemical Formula (IX)

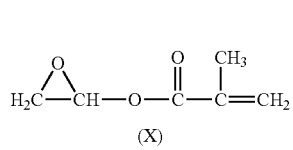

(IX)

5. The low temperature-cured polymer gate insulation layer according to claim 1, wherein the epoxy-based compound of the Chemical Formula (III) is at least one of compounds given in Chemical Formulae (X), (XIII) and (XIV) as depicted below:

Chemical Formula (X)

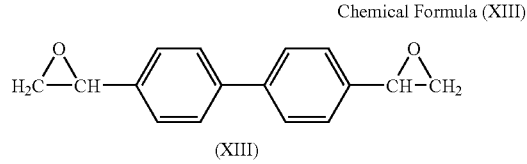

(X)

Chemical Formula (XIII)

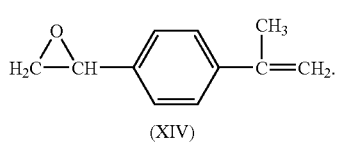

(XIII)

Chemical Formula (XIV)

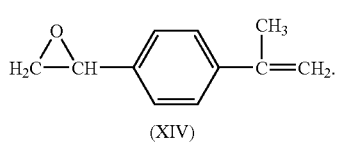

(XIV)

6. The low temperature-cured polymer gate insulation layer according to claim 1, formed by performing the steps of:
dissolving the acrylate-based compound, the anhydride-based compound, the epoxy-based compound in an organic solvent to obtain a solution;
coating a substrate on which the gate Insulation layer is formed, with the obtained solution; and
thermally curing the coated substrate at a low temperature.

7. The low temperature-cured polymer gate insulation layer according to claim 6, wherein the organic solvent includes propylene glycol monomethyl ether acetate or ethyl-3-ethoxypropionate.

8. The low temperature-cured polymer gate insulation layer according to claim 6, wherein the thermal-curing is performed at a temperature of 150° C. or less.

9. An organic thin film transistor comprising an organic active layer, a gate electrode, and source-drain electrodes, wherein the transistor comprises a low temperature-cured polymer gate insulation layer according to claim 1, on the gate electrode.

10. The low temperature-cured polymer gate insulation layer according to claim 6, wherein, excluding the organic solvent, the dissolved acrylate-based compound of Chemical Formula (IV) comprises 30% wt/wt, the dissolved acrylate-based compound of Chemical Formula (V) comprises 40% wt/wt, the dissolved anhydride-based compound of Chemical Formula (VII) comprises 10% wt/wt, the dissolved epoxy-based compound of Chemical Formula (X) comprises about 10% wt/wt wherein Chemical Formula (IV) comprises

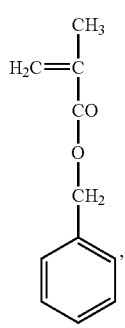
(IV)

Chemical Formula (V) comprises

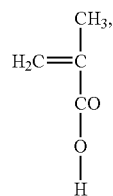
(V)

Chemical Formula (VII) comprises

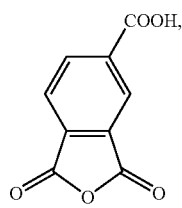
(VII)

and

Chemical Formula (X) comprises

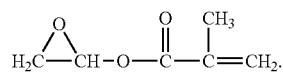
(X)

* * * * *